(12) United States Patent
Ando

(10) Patent No.: US 9,865,425 B2
(45) Date of Patent: Jan. 9, 2018

(54) SAMPLE HOLDER AND SAMPLE HOLDER SET

(71) Applicant: HITACHI HIGH-TECH SCIENCE CORPORATION, Tokyo (JP)

(72) Inventor: Kazunori Ando, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 15/193,922

(22) Filed: Jun. 27, 2016

(65) Prior Publication Data

US 2017/0062175 A1 Mar. 2, 2017

(30) Foreign Application Priority Data

Sep. 1, 2015 (JP) ................. 2015-171867

(51) Int. Cl.
*H01J 37/20* (2006.01)
*G02B 21/00* (2006.01)

(52) U.S. Cl.
CPC .............. *H01J 37/20* (2013.01); *G02B 21/00* (2013.01)

(58) Field of Classification Search
CPC .................................. H01J 37/20; G02B 21/00
USPC ................. 250/440.11, 441.11, 442.11, 443.1
See application file for complete search history.

(56) References Cited

U.S. PATENT DOCUMENTS

2006/0024923 A1* 2/2006 Sarma ................... H01L 23/544
438/462

2009/0065708 A1 3/2009 Moon et al.
2012/0126115 A1 5/2012 Heise et al.
2012/0133757 A1 5/2012 Thomas et al.

FOREIGN PATENT DOCUMENTS

JP 2012-015033 1/2012

OTHER PUBLICATIONS

"ZEISS Webinar: Strategies for Correlative Microscopy in Bioscience Research", ZEISS Microscopy, Apr. 12, 2013, XP054977077, 1 page, available at https://www.youtube.com/watch?v=zACiYWz_X8w.
"ZEISS Webinar: Strategies for Correlative Microscopy in Bioscience Research", ZEISS Microscopy, Apr. 12, 2013, XP055336255, 2 pages, available at https://www.youtube.com/watch?v=zACiYWz_X8w, video around 26:55, 28:09 and 29:15.

(Continued)

*Primary Examiner* — Nicole Ippolito
(74) *Attorney, Agent, or Firm* — Hamre, Schumann, Mueller & Larson, P.C.

(57) ABSTRACT

Disclosed herein is a sample holder which holds a sample such that a surface is exposed and can be mounted in each of multiple measurement devices that perform measurement based on different measurement principles so that properties of the sample can be measured by each of the measurement devices. The sample holder includes: a main body that surrounds the sample; alignment marks that are arranged at each of two or more different positions in a surface of the main body and can be detected by the measurement devices; and a sample-retaining portion that is disposed within the main body and retains the sample such that a height difference between a mark surface of the alignment mark and the surface of the sample is set to a predetermined value.

3 Claims, 5 Drawing Sheets

(56) References Cited

OTHER PUBLICATIONS

"Shuttle & Find for ZEN Imaging Software Speed Up Your Correlative Workflow", ZEISS Microscopy, Jan. 1, 2013, XP055336306, 15 pages, available at https://applications.zeiss.com/C125792900358A3F/0/62414EAA22FB548BC1257B94004AC559/$FILE/EN_41_011_041_Shuttle_Find.pdf.

"Software Guide ZEN 2 (blue edition) The Shuttle & Find Module", ZEISS Microscopy, Jan. 1, 2014, XP055336315, 39 pages, available at https://applications.zeiss.com C125792900358A3F/0/1114794E9D6D23B1C1257D9C003FC623/$FILE/ZEN_2_Shuttle_and_Find_Software_Guide.pdf.

Extended European Search Report, issued in the corresponding European patent application 16179243.7, dated Jan. 26, 2017, 11 pages.

* cited by examiner

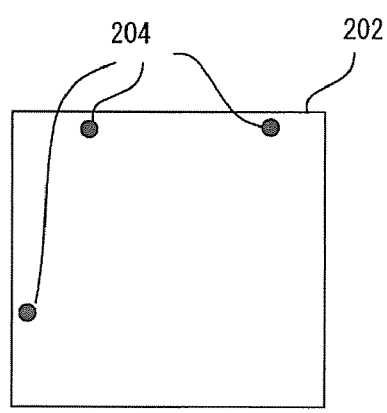
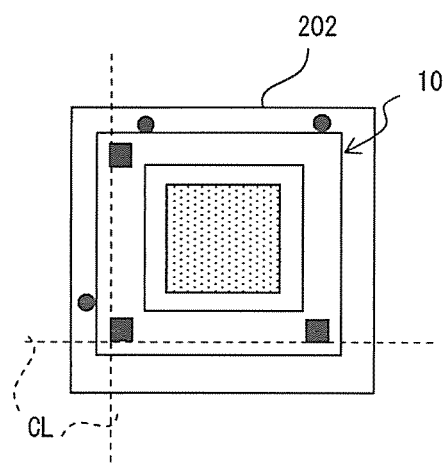
FIG. 3A    FIG. 3B
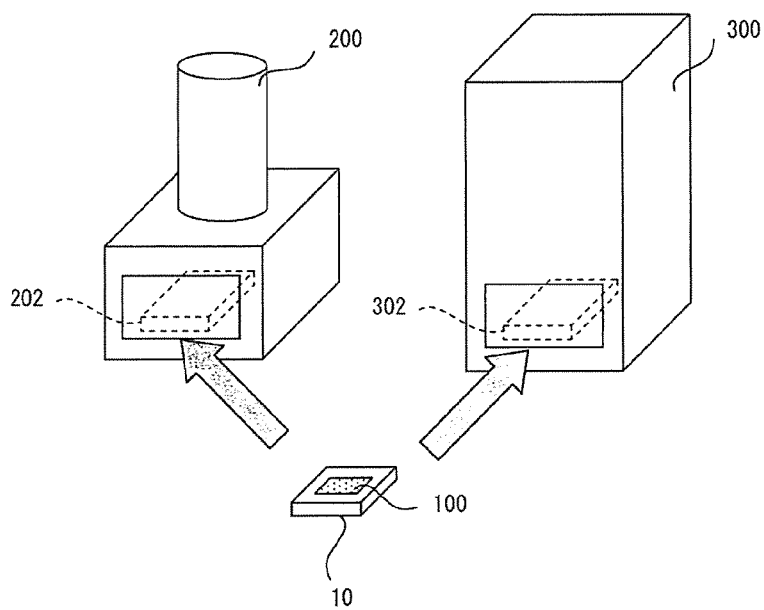
FIG. 4

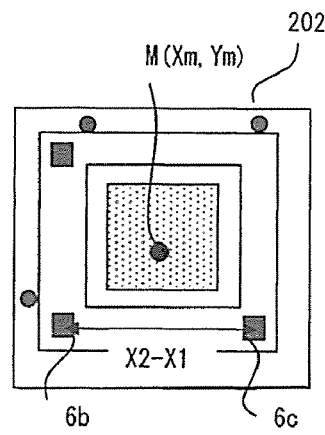 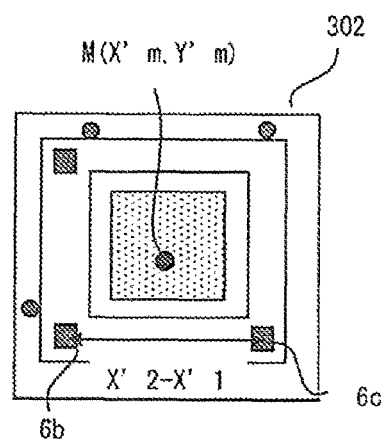
FIG. 5A   FIG. 5B
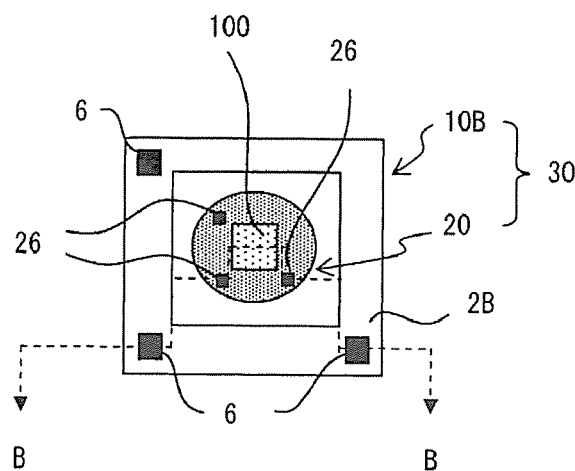
FIG. 6

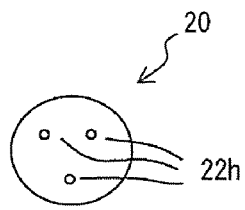
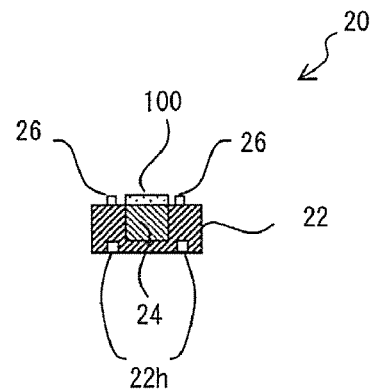
FIG. 9A          FIG. 9B
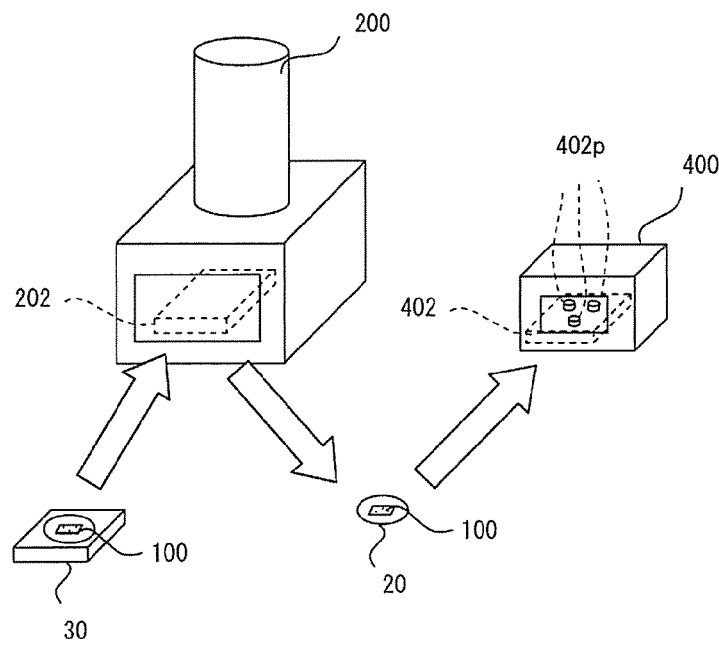
FIG. 10

SAMPLE HOLDER AND SAMPLE HOLDER SET

CROSS REFERENCE TO RELATED APPLICATION(S)

This application claims the benefit of Japanese Patent Application No. 2015-171867, filed Sep. 1, 2015, which is hereby incorporated by reference in its entirety into this application.

BACKGROUND OF THE INVENTION

1. Technical Field

The present invention relates to a sample holder and a sample holder set each holding a sample thereon and being installed inside a measurement device such as a scanning electron microscope or a scanning probe microscope.

2. Description of the Related Art

There are various measurement devices (analyzer) that perform measurement based on different measurement principles. For example, a probe microscope uses a cantilever for measurement and can perform mapping of physical properties such as current, viscoelasticity, frictional force, and absorptivity as well as obtain information about sample's surface topography. A scanning electron microscope (SEM) uses an electron beam for measurement and can perform atom-mapping as well as analyze a sample's surface topography. An optical microscope, an optical coherence microscope, or a laser microscope uses a light beam or a laser for measurement and can analyze sample's surface topography.

In order to measure properties of an identical portion of a sample with various measurement devices that perform measurement based on different measurement principles, it is required to install a sample in a single complex measurement device in which various measurement devices are combined with each other. For example, Patent Document 1 discloses a technology by which an SEM and an optical lens column are arranged in a V-shaped pattern, a first measurement is performed on a portion of a sample by the SEM, and a second measurement is performed on the identical portion of the same sample by another measurement device. This device changes the direction of the sample using a tiling mechanism so that the surface of the sample is disposed to be perpendicular to axes of the SEM and the optical lens column.

However, the technology of Patent Document 1 has a problem that it is difficult to precisely align optical axes between different kinds of measurement devices, precision in the order of a micrometer. To be specific, there are two focal points on different observation axes (an optical axis of an SEM and an optical axis of an optical microscope), and it is very difficult to achieve a precise positional alignment of the focal points. Specifically, it is necessary to cross the two focal points within a range of micrometers and align the crossed focal points with an observation (measurement) point of the sample on which the observation (measurement) is performed. This is because, in an actual focusing process, a deviation from an ideal linear axis during a mechanical adjustment or a displacement of an observation axis occurs along an arc.

Furthermore, the device of Patent Document 1 can perform only two kinds of measurements (a measurement based on an SEM and a measurement based on an optical microscope). Therefore, when it is necessary to perform another kind of measurement apart from the measurements based on an SEM and an optical microscope, the device cannot meet the demand. In this case, it may be necessary to use a more complex measurement device equipped with an additional measurement device as well as an SEM and an optical microscope.

DOCUMENT OF RELATED ARTS

Patent Document (Patent Document 1) Japanese Patent Application Publication No. 2012-015033

SUMMARY OF THE INVENTION

Accordingly, the present invention has been made keeping in mind the above problems occurring in the prior art, and an object of the present invention is to provide a sample holder and a sample holder set, either of which enables multiple measurement devices that easily perform measuring based on different measurement principles to perform measurement on an identical position of a same sample.

According to one aspect of the present invention, there is provided a sample holder which holds a sample such that a surface of the sample is exposed and, can be mounted in each of multiple measurement devices that perform measurement based on different measurement principles. The sample holder includes: a main body surrounding the sample; multiple alignment marks that are disposed at two or more different positions in a surface of the main body and can be detected by the measurement devices; and a sample-retaining portion that is disposed within the main body and retains the sample such that a height difference between a mark surface of the alignment mark and the surface of the sample is set to a predetermined value.

According to the sample holder, multiple measurement devices can perform measurement on an identical portion of a same sample with high precision by using coordinates of the positions of the alignment marks formed on the sample holder for position alignment. In addition, since the height difference between the surface of the sample and the mark surface of the alignment mark is set to a predetermined value, it is possible to reduce an error in position alignment attributable to second focusing that is performed to observe the surface of the sample in a conventional art, after first focusing to detect the mark surface of the alignment mark is performed because a predetermined difference in the height direction is maintained and thus the second focusing is unnecessary according to the aspect of the present invention. Particularly, when the height difference between the mark surface of the alignment mark and the surface of the sample is within a focal depth of the measurement device, when the measurement device is focused on the mark surface of the alignment mark, the surface of the sample can also be observed. Therefore, it is not necessary to perform refocusing to observe the surface of the sample after detecting the mark surface of the alignment mark. Furthermore, since a positional misalignment attributable to the refocusing that is performed to observe the surface of the sample is eliminated, measurements of an identical portion of a sample by multiple measurement devices can be performed with high precision.

According to another aspect, there is provided a sample holder set including: a first sample holder which holds a sample such that a surface of the sample is exposed and is mounted in a first measurement device of multiple measurement devices that perform measurement based on different measurement principles so that properties of the sample can be measured; and a second measurement device that holds the first sample holder holding the sample, wherein the first sample holder includes a first main body that surrounds the sample, alignment marks that are disposed at each of two or more different positions in a surface of the first main body and which can be detected by the first measurement device, and a first sample-retaining portion that is disposed within the first main body and retains the sample such that a height difference between a mark surface of the alignment mark and the surface of the sample is set to a predetermined value, wherein the second sample holder includes a second main body that surrounds the first sample holder and a holder-retaining portion that is disposed within the second main body and holds the first sample holder therein, and wherein among the multiple measurement devices, the sample holder set is mounted in a second measurement device that has a larger measurement field of view than the first measurement device and the alignment marks are detected, thereby enabling measurement on the sample.

According to measurement devices that differ in measurement principles, there may be a measurement device in which the first sample holder that is smaller cannot be fixed to a stage. In this case, the first sample holder is fixed to the stage via the second sample holder that is larger than the first sample holder. Therefore, even a small sample holder can be fixed to a stage of a measurement device via a large sample holder.

According to a further aspect, there is provided a sample holder set including: a first sample holder which holds a sample such that a surface of the sample is exposed and is mounted in a first measurement device of multiple measurement devices that perform measurement based on different measurement principles respectively so that properties of the sample can be measured; and a second sample holder that holds the first sample holder holding the sample, wherein the first sample holder includes a first main body that surrounds the sample, first alignment marks that are disposed at each of two or more positions in a surface of the first main body and can be detected by the first measurement device, and a first sample-retaining portion that is disposed within the first main body and retains the sample such that a height difference between a mark surface of the first alignment mark and the surface of the sample is set to a predetermined value, wherein the second sample holder includes a second main body surrounding the first sample holder, second alignment marks that are disposed at each of two or more different positions in a surface of the second main body, and a holder-retaining portion that is disposed within the second main body and retains the first sample holder, and wherein among the multiple measurement devices, the sample holder set is mounted in a second measurement device that has a larger measurement field of view than the first measurement device so that the second measurement marks are detected, thereby enabling measurement on the sample.

According to the present invention, it is possible to provide a sample holder or a sample holder set that enable an identical portion of a sample to undergo measurement by multiple measurement devices that perform measurement based on different measurement principles easily.

BRIEF DESCRIPTION OF THE DRAWINGS

The above and other objects, features and advantages of the present invention will be more clearly understood from the following detailed description taken in conjunction with the accompanying drawings, in which:

FIGS. 3A and 3B are plan views illustrating a stage that is installed in a measurement device and is used to support a sample holder thereon;

FIG. 4 is a schematic view illustrating a state in which a sample holder is mounted first in a measurement device of multiple measurement devices and is then moved to another measurement device one after another and in which an identical portion of a single sample undergoes measurement by each of the multiple measurement devices;

FIG. 5A and FIG. 5B are a schematic view illustrating a method of calculating a coordinate of a measurement position in a sample in a next measurement device through coordinate conversion, from a coordinate of an alignment mark in a previous measurement device;

FIG. 6 is a plan view illustrating a sample holder set according to another embodiment of the present invention;

FIGS. 9A and 9B are a bottom view and a cross-sectional view illustrating recesses formed in a first sample holder retained by the holder-retaining portion, respectively; and FIG. 10 is a schematic view illustrating a state in which a sample holder set and a first sample holder are mounted sequentially in measurement devices and each measurement device performs measurement on a sample.

DESCRIPTION OF THE PREFERRED EMBODIMENTS

Hereinafter, preferred embodiments of the present invention will be described with reference to the accompanying drawings.

Figure 1:
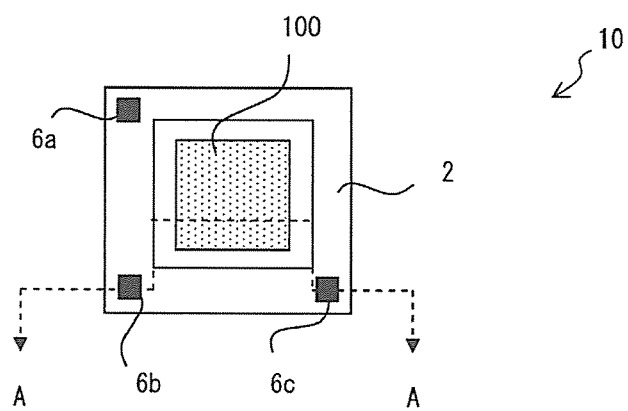
FIG. 1 is a plan view illustrating a sample holder according to one embodiment of the present invention.
Figure 2:
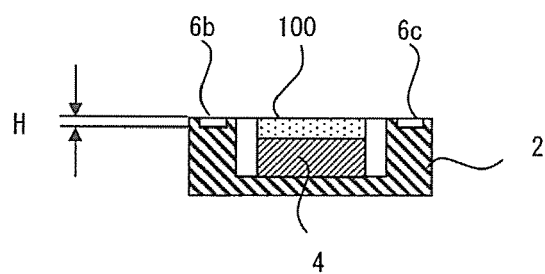
FIG. 2 is a cross-sectional view taken along a line A-A of FIG. 1.

FIG. 1 is a plan view illustrating a sample holder 10 according to one embodiment of the present invention and FIG. 2 is a cross-sectional view taken along a line A-A of FIG. 1.

The sample holder 10 includes a main body 2 that has a rectangular frame-shaped portion and a bottom end portion; alignment marks 6a to 6c formed at each of two or more different positions (for example, three in FIG. 1) in a surface of the main body 2, and a sample-retaining portion 4 that is disposed within the main body 2 and holds the sample so that the sample cannot be moved.

According to the present embodiment, the sample-retaining portion 4 is a group of multiple rectangular spacers having different heights from each other. Any one of the spacers is selectively used according to a thickness (or height) of the sample 100. The sample-retaining portion 4 is fixed to an upper surface of the bottom end portion of the main body 2 via an adhesive tape, and the sample 100 is fixed to the surface of the sample-retaining portion 4 via an adhesive tape. In this manner, it is possible to set a height difference between the surface of the sample 100 and the mark surfaces of the alignment marks 6a to 6c to a predetermined value. To be specific, as illustrated in FIG. 2, according to the present embodiment, the surface of the sample 100 and the surface of the main body 2 are substantially flush with each other. The alignment marks 6a to 6c have bottom surfaces serving as mark surfaces. The surface of the main body 2 is pitted with the alignment marks 6a to 6c. The mark surfaces are lower than the surface of the sample 100 by a predetermined height H. Each of the alignment marks 6a to 6c has a rectangular shape with each side having a size of several tens of micrometers. Herein, the predetermined height H may be about 10 µm, for example.

The predetermined height H may be set such that the alignment marks 6a to 6c are detected by any one of the measurement devices, the height difference between the mark surfaces of the alignment marks 6a to 6c and the surface of the sample 100 is within a range of a focal depth of the measurement device. When the height difference H between the mark surfaces of the alignment marks and the surface of the sample 100 is within a range of the focal depth of a measurement device to be used, once the measurement device is brought into focus on the mark surface, the surface of the sample 100 also can be observed because the surface of the sample 100 is disposed within a range of the focal depth of the measurement device. Therefore, it is unnecessary to perform refocusing for the purpose of observation of the surface of the sample 100 after detection of the alignment mark is performed.

Generally, verticality of an observation axis of a measurement device with respect to an object to be observed (herein, the mark surface of the alignment mark or the surface of the sample) slightly differs from 90°. At this point, when the surface of the sample is slightly moved in a Z direction for the purpose of alignment, a misalignment in X and Y directions occurs. Therefore, although we try to observe an identical portion of a sample with multiple measurement devices while using XY coordinates of the mark surfaces of the alignment marks as reference points, the XY coordinates serving as reference points are changed during refocusing that is performed to observe the surface of the sample. Therefore, it is very difficult to perform measurement on the same portion of a sample with multiple measurement devices.

Particularly, as described below, when multiple measurements are performed using one sample holder 10 and multiple measurement devices 200 and 300, since the verticality varies for each of the measurement devices 200 and 300, it is required to perform a position alignment for every measurement device. Therefore, errors are increased. For this reason, it becomes more difficult to perform measurement on the same portion of the same sample 100.

However, according to the present invention, since the height difference H between the mark surface of the alignment mark and the surface of the sample 100 is set to be smaller than the focal depth of measurement devices, the mark surface of the alignment mark and the surface of the sample 100 can be observed within the same field of view (i.e. at the same time). Therefore, it is unnecessary to perform refocusing for observation of the surface of the sample after performing focusing for observation of the mark surface of the alignment mark.

When the field of view of a measurement device is about 200 µm×200 µm, it is preferable that the predetermined height H is set to about 10 µm. However, in case that it is necessary to perform refocusing for observation of the surface of the sample 100 after performing focusing for observation of the mark surfaces of the alignment marks and obtaining XY coordinates of the mark surfaces of the alignment marks, when an amount of movement in the Z direction during the refocusing is negligible, the height difference H between the mark surfaces of the alignment marks and the surface of the sample 100 is not necessarily within the range of the focal depth of the measurement device. That is, it does not matter that the height difference H exceeds 10 µm when the range of vision of the measurement device is 200 µm×200 µm. However, the preferable height difference H may be zero (0).

When the alignment marks 6a to 6c are recesses, the mark surfaces are bottom surfaces of the recesses.

FIGS. 3A and 3B are plan views illustrating a stage 202 that is installed in the measurement device 200 (refer to FIG. 4) and is used to support the sample holder 10 thereon. The stage 202 has a substantially rectangular shape and is provided with three guide pins 204 arranged near edges thereof (refer to FIG. 3A). The sample holder 10 is placed inside the guide pins 204 on an upper surface of the stage 202. The edges of the sample holder 10 are in contact with the guide pins 204 (refer to FIG. 3B). In this case, when the sample holder 10 is placed on the stage 202, a position alignment may be automatically achieved.

FIG. 4 is a schematic view illustrating a state in which the sample holder 10 is mounted in the multiple measurement device 200 and is then moved to the multiple measurement device 300 and measurement for the sample 100 is performed by each of the measurement devices 200 and 300. In the example of FIG. 4, the measurement devices 200 and 300 may be a scanning electron microscope (SEM) and a scanning probe microscope (SPM), respectively. The measurement device 300 is equipped with an optical microscope used for observation of the sample.

The sample holder 10 holds the sample 100 such that the surface of the sample is exposed and, is fixed to the stage 202 or 302 disposed in the measurement device 200 or 300.

To be specific, the sample holder 10 is mounted in the measurement device 200, at least one mark surface of the mark surfaces of the alignment marks 6a to 6c is then detected as an image (for example, secondary electron image: SEI) obtained by an electron beam in the measurement device 200, and the stage 202 is then moved in the Z direction so that the mark surface can be focused.

Next, a coordinate of a measurement position on the surface of the sample 100 and coordinates of the alignment marks 6a to 6c are obtained using an SEM image formed by the measurement device 200. To be specific, as illustrated in FIG. 3B, when a lower left corner of the alignment mark 6b is aligned with a cross point of a cross line CL in the SEM image observed by the measurement device 200, it is possible to obtain a coordinate of the alignment mark 6b from an amount of movement of the stage 202, in the X and Y directions, from an initial position of the stage 202. In this way, a coordinate (X1, Y1) of the alignment mark 6a, a coordinate (X2, Y2) of the alignment mark 6b, and a coordinate (X3, Y3) of the alignment mark 6c can be obtained.

When the cross line CL in the SEM image is aligned with a center point of the alignment mark, precision in position alignment is low because it is difficult to determine, with naked eyes, whether the cross point is disposed at the center point of the alignment mark. However, when the alignment mark has a rectangular shape and a lower left corner of the alignment mark is aligned with the cross line CL, a precision in position alignment is increased. Further, the cross line CL is aligned with the lower left corner of the alignment mark, all of the rest alignment marks are also aligned with the lower left corner.

Next, the stage 202 is moved to a position M (hereinafter, referred to as measurement position M) at which the sample 100 is to be measured. Then, an XY coordinate (Xm, Ym) of the measurement position M is obtained and the measurement device 200 produces a scanning electron image of the sample 100. After the measurement is finished (that is, a scanning electron image is produced), the sample holder 10 is taken out of the measurement device 200, and is then mounted in the measurement device 300. In the measurement device 300, at least one of the mark surfaces of the alignment marks 6a to 6c is observed with use of the optical microscope provided to the measurement device 300 and the stage 302 is moved in the Z direction so that the mark surface is focused.

When a sample is a semiconductor wafer, the sample is originally provided with alignment marks. However, when a sample is not a semiconductor wafer, it is difficult to form alignment marks in the sample. Moreover, there is a problem that the thickness (height) of the sample may vary from position to position. To solve this problem, according to the present invention, the sample holder 10 is provided with the alignment marks 6, thereby enabling an XY coordinate of a measurement position in the sample 100 to be obtained.

Next, coordinates of the alignment marks 6a to 6c are obtained with use of the optical microscope of the measurement device 300. A method of obtaining coordinates of the alignment marks 6a to 6c is the same as one used for the measurement device 200. By performing the same method in the measurement device 300, a coordinate (X'1, Y'1) of the alignment mark 6a, a coordinate (X'2, Y'2) of the alignment mark 6b, and a coordinate (X'3, Y'3) of the alignment mark 6c are obtained.

Next, a coordinate conversion is performed on the coordinates of the alignment marks 6a to 6c obtained by the measurement device 200 and the coordinates of the alignment marks 6a to 6c obtained by the measurement device 300, to calculate a coordinate (X'm, Y'm) of the measurement position M of the sample 100 in the measurement device 300.

Specifically, as illustrated in FIG. 5A and FIG. 5B, a distance between the alignment mark 6b and the alignment mark 6c in the X direction in the measurement device is X2−X1, and a distance between the alignment mark 6b and the alignment mark 6c in the X direction in the measurement device 300 is X'2−X'1. Accordingly, an X coordinate X'm of the measurement position M of the sample 100 in the measurement device 300 can be calculated by the equation "X'm=Xm x (X'2−X'1)/ (X2−X1)". A Y coordinate Y'm of the measurement position M is also calculated in the same manner.

Using this method, physical properties at the measurement position M of the sample 100 in the measurement device 300 are mapped, and thus the same measurement position M of the same sample 100 can be measured by the different measurement devices 200 and 300.

Next, a sample holder set composed of a plurality of sample holders according to one embodiment of the present invention will be described with reference to FIGS. 6 to 9B.

Figure 7:
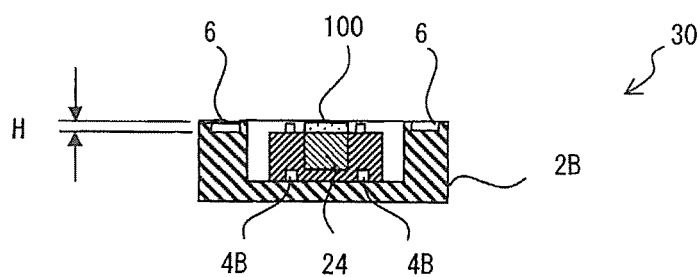
FIG. 7 is a cross-sectional view taken along a line B-B of FIG. 6.
Figures 8A, 8B:
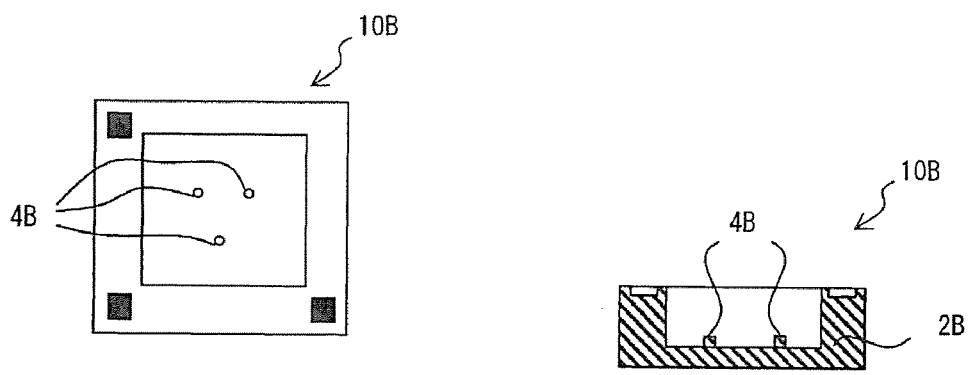
FIGS. 8A and 8B are a plan view and a cross-sectional view illustrating a holder-retaining portion of a second sample holder, respectively.

FIG. 6 is a plan view illustrating a sample holder set 30 according to the present embodiment and FIG. 7 is a cross-sectional view taken along a line B-B.

The sample holder set 30 includes a first sample holder 20 and a second sample holder 10B that is arranged to surround the first sample holder 20 and holds the first sample holder 20 therein.

The second sample holder 10B is almost the same as the sample holder 10 described above. That is, the second sample holder 10B includes: a second main body 2B having a rectangular-frame shaped portion and having a bottom end portion; and alignment marks 6 respectively formed at two or more different positions (for example, three in FIG. 6) in a surface of the second main body 2B; and a holder-retaining portion 4B that is disposed inside the second main body 2B and holds the first sample holder 20 so that the first sample holder 20 cannot be moved. The sample holder 10B differs from the sample holder 10 only in that the sample holder 10B has the holder-retaining portion 4B instead of the sample-retaining portion 4. The holder-retaining portion 4B is composed of three guide pins (see FIGS. 8A and 8B) that protrude upward from three positions in an upper surface of the bottom end portion of the main body 2.

The first sample holder 20 includes: a first main body 22 including a cylinder-shaped portion surrounding the sample 100 and a bottom end portion, first alignment marks 26 disposed at two or more different positions (three positions in FIG. 1) in a surface of the first main body 22, and a first sample-retaining portion 24 that is disposed inside the first main body 22 and retains a sample so that the sample cannot be moved. The first sample-retaining portion 24 is composed of a plurality of spacers having different heights from each other like the sample-retaining portion 4. Any one of the spacers of the first sample-retaining portion 24 is selected according to the height (thickness) of the sample 100, and the selected spacer is fixed to an upper surface of the bottom end portion of the first main body 22 via an adhesive tape. Next, the sample 100 is fixed to the surface of the first sample-retaining portion 24 via an adhesive tape or the like. In this way, it is possible to set a height difference between the surface of the sample 100 and the mark surface of the first alignment mark 26 to a predetermined value. To be specific, as illustrated in FIG. 7, according to the present embodiment, the surface of the sample 100 and the mark surface of the first alignment mark 26 that protrudes from the surface of the first main body 22 are substantially flush with each other.

The first alignment mark 26 may be a protrusion and the mark surface may be the top surface of the protrusion.

A second alignment mark 6 of the second sample holder 10B is lower than the surface of the sample 100 by a predetermined height H.

In addition, as illustrated in FIGS. 9A and 9B, a lower surface of the first main body 22 is provided with three recesses 22h that are formed in positions corresponding to the guide pins serving as the holder-retaining portion 4B. The first sample holder 20 is received within the second sample holder 10B and the guide pins serving as the holder-retaining portions 4B are inserted into the respective recesses 22h. In this way, a position alignment of the first sample holder 20 with respect to the second sample holder 10B is automatically achieved when the first sample holder 10 is received within the second sample holder 10B.

FIG. 10 is a schematic view illustrating a state in which the sample holder set 30 or the first sample holder 20 are mounted in measurement devices 200 and 400 that perform measurement based on different measurement principles and in which the measurement devices 200 and 400 perform measurement on the sample 100 in turns. In the example of FIG. 10, the measurement device 200 is an SEM and the measurement device 400 is a scanning probe microscope in which the stage 402 is manually moved and which is equipped with an optical microscope used for observation of a sample.

The measurement device 200 has a larger measurement area (larger field of view) than the measurement device 400. The measurement devices 200 and 400 correspond to "second measurement device" and "first measurement device" in claims, respectively. Typically, a measurement device in which a stage is moved by an electric motor has a larger measurement area than a measurement device in which a stage is manually moved.

A measuring process will be described below. First, the sample holder set 30 is mounted on the stage 202 in the measurement device 200. Next, a process of adjusting a focal point (i.e. focusing) in the measurement device 200 is performed in the same manner described above. Next, a coordinate of a measurement position in the surface of the sample 100, coordinates of the respective alignment marks 6, and a coordinate of a measurement position M of the sample 100 are obtained using an SEM image produced by the measurement device 200. Next, the measurement device 200 produces a scanning electron microscope image of the sample 100.

When the measurement device 200 finishes measurement on the sample 100, the sample holder set 30 is taken out of the measurement device 200. Next, the first sample holder 20 is detached from the sample holder set 30 and is then mounted in the measurement device 400. Next, focusing is performed in the measurement device 400. Next, XY coordinates of each alignment mark and a measurement position M are obtained. The stage 402 is provided with three guide pins 402p that are the same as the holder-retaining portion 4B. As the guide pins 402p are inserted into the recesses 22h, the first sample holder 20 is automatically positionally aligned and retained on the stage 402.

The alignment marks 6 and 26 may be recesses and protrusions respectively. Each of the alignment marks has a height difference with respect to the surface of the sample 100, and the height difference in the Z direction may be H. As described above the height difference H may be set to be within a range of a focal depth of each of the measurement devices 200 and 400.

Next, coordinates of the alignment marks 26 are obtained by using an optical microscope in the measurement device 400.

In the same manner described above for the sample holder 10 (see FIG. 5A and FIG. 5B), a coordinate (X'm, Y'm) of a measurement position M of the sample 100 in the measurement device 400 is calculated by performing a coordinate conversion process on the coordinates of the alignment marks 6 in the measurement device 200 and the coordinates of the alignment marks 26 in the measurement device 400.

Thus, predetermined physical properties at the measurement position in the measurement device 400 are mapped. In this way, the measurement devices 200 and 400 can perform measurement with respect to the identical measurement position M of the same sample 100.

In addition, since the stage 402 in the measurement 400 is manually moved, an amount of movement of the stage cannot be automatically detected unlike the stage moved by electric motor, etc. To solve this problem, the measurement device 400 is provided with a grid or a lattice. Therefore, when observing the sample using an optical microscope, the coordinates of the alignment marks can be obtained by reading divisions of the grid.

In addition, since the stage 402 in the measurement device 400 is manually moved, it is impossible to automatically detect an amount of movement of the stage 402 and thus is difficult to precisely obtain a coordinate of the measurement position M of the sample and coordinates of the alignment marks. Therefore, when observing the sample using the measurement device 400, if the measurement position M is determined after an XY coordinate used as a reference point is obtained by observing all of the alignment marks within the same range of vision, it becomes easy to use lines (divisions) of the grid or the lattice as references to obtain XY coordinates.

In addition, as for the measurement device 200, the alignment marks 26 as well as the alignment marks 6 may be detected for alignment. The alignment marks 6 and 26 may be selectively used according to a property of the sample to be measured. There may be a case in which it is unnecessary to use the alignment marks 6 formed in the sample holder 10B. In this case, only the alignment marks 26 are detected. According to stages of multiple measurement devices that perform measurement based on different measurement principles, there may be a case in which it is difficult to fix the first sample holder 20 having a small size onto a stage. In this case, the second sample holder 10B that is larger than the first sample holder 20 may be fixed to the stage, with the first sample holder 20 received in the second sample holder 10B. That is, the first sample holder 20 can be fixed to each stage of the multiple measurement devices via the second sample holder 10B.

The present invention is not limited to the embodiments described above. For example, examples of the multiple measurement devices that perform measurement based on different measurement principles may include an optical coherence microscope, a laser microscope, an optical microscope, and so on, besides an SEM and a scanning probe microscope.

Preferably, the number of alignment marks used is three or more. When the number of alignment marks is two, the two alignment marks may be diagonally arranged. As for the alignment marks, a steeper profile results in higher precision in focusing. Specifically, when the alignment marks are formed through mechanical or laser processing, the profile is likely to be tapered, so that a detection error is increased. Therefore, it is preferable that a dot pattern formed through an etching process be used as the alignment marks.

The sample-retaining portion 4 or the first sample-retaining portion 24 may be structured such that their heights can be increased and decreased, for example, in a way of screwing or unscrewing a screw.

The holder-retaining portion 4B may be a dovetail joint or a mechanical joint such as a hook besides the guide pins.

In addition, in the measurement device 400 in which the stage 402 is manually moved, when the measurement device 400 is provided with a gauge that can precisely read an amount of movement of the stage that is manually moved, all of the alignment marks may not be necessarily observed within the same field of view but only a portion of the alignment marks (for example, one alignment mark) may be observed within the same field of view. This also applies to the measurement device 200.

In addition, the sample holder 10B may not be limited to a cylinder shape but may have a polygonal shape.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sample holder which holds a sample such that a surface of the sample is exposed and, can be mounted in each of multiple measurement devices that perform measurement based on different measurement principles respectively so that properties of the sample can be measured by each of the measurement devices, the sample holder comprising:

a main body that surrounds the sample;
alignment marks that are arranged at each of two or more different positions on a surface of the main body and can be detected by the measurement devices; and
a sample-retaining portion that is disposed within the main body and retains the sample such that a height difference between a mark surface of the alignment mark and the surface of the sample is set to a predetermined value,
wherein the height difference between the mark surface of the alignment mark and the surface of the sample is set within a range of a focal depth of the each of the measurement devices.

2. A sample holder set comprising:
a first sample holder which holds a sample such that a surface of the sample is exposed and, is mounted in a first measurement device of multiple measurement devices that perform measurement based on different measurement principles respectively so that properties of the sample can be measured; and
a second sample holder that holds the first sample holder holding the sample,
wherein the first sample holder includes a first main body that surrounds the sample, alignment marks that are disposed at each of two or more different positions in a surface of the first main body and can be detected by the first measurement device, and a first sample-retaining portion that is disposed within the first main body and retains the sample such that a height difference between a mark surface of the alignment mark and the surface of the sample is set to a predetermined value,
wherein the second sample holder includes a second main body that surrounds the first sample holder and a holder-retaining portion that is disposed within the second main body and holds the first sample holder, and
wherein among the multiple measurement devices, the sample holder set is mounted in a second measurement device that has a larger measurement field of view than the first measurement device and the alignment marks are detected, thereby enabling measurement of the sample.

3. A sample holder set comprising:
a first sample holder which holds a sample such that a surface of the sample is exposed and, is mounted in a first measurement device of multiple measurement devices that perform measurement based on different measurement principles respectively so that properties of the sample can be measured; and
a second sample holder that holds the first sample holder holding the sample,
wherein the first sample holder includes a first main body that surrounds the sample, first alignment marks that are disposed at each of two or more different positions in a surface of the first main body and can be detected by the first measurement device, and a first sample-retaining portion that is disposed within the first main body and retains the sample such that a height difference between a mark surface of the first alignment mark and the surface of the sample is set to a predetermined value,
wherein the second sample holder includes a second main body surrounding the first sample holder, second alignment marks that are disposed at each of two or more different positions in a surface of the second main body, and a holder-retaining portion that is disposed within the second main body and retains the first sample holder, and
wherein among the multiple measurement devices, the sample holder set is mounted in a second measurement device that has a larger measurement field of view than the first measurement device and the second measurement marks are detected, thereby enabling measurement of the sample.

* * * * *